United States Patent
Fang et al.

(10) Patent No.: US 6,221,699 B1
(45) Date of Patent: Apr. 24, 2001

(54) METHOD OF FABRICATING AN INFRARED OPTICAL BULK CHANNEL FIELD EFFECT TRANSISTOR

(76) Inventors: Yean-Kuen Fang, No. 6, Lane 38, Sect. 3, Chang Ho St.; Fu-Yuan Chen, 2 Sec. 2 Min-Tsu Rd., both of Tainan; Jiann-Ruey Chen, 101 Sec. 2, Kuang Fu Road, Hsinchu, all of (TW)

( * ) Notice: Subject to any disclaimer, the term of this patent is extended or adjusted under 35 U.S.C. 154(b) by 0 days.

(21) Appl. No.: 09/179,399

(22) Filed: Oct. 27, 1998

Related U.S. Application Data

(62) Division of application No. 08/762,961, filed on Dec. 12, 1996, now Pat. No. 5,838,034.

(51) Int. Cl.$^7$ .................................................. H01L 29/78
(52) U.S. Cl. ............................. 438/142; 438/3; 438/167; 257/295; 257/314
(58) Field of Search .................... 257/222, 295, 257/314; 438/142, 167, 3

(56) References Cited

U.S. PATENT DOCUMENTS

| | | | |
|---|---|---|---|
| 4,074,302 | 2/1978 | Brewer | 257/24 |
| 4,245,230 | 1/1981 | Kwok et al. | 257/216 |
| 4,598,305 | 7/1986 | Chiang et al. | 257/216 |
| 4,814,844 | 3/1989 | Bluzer | 257/24 |
| 4,865,427 | 9/1989 | Kingston et al. | 350/355 |
| 5,189,593 | 2/1993 | Ooi | 257/295 |
| 5,248,564 | 9/1993 | Ramesh | 257/295 |
| 5,331,187 | 7/1994 | Ogawa | 257/295 |
| 5,418,389 | 5/1995 | Watanabe | 257/295 |
| 5,449,935 | 9/1995 | Nakamura | 257/295 |
| 5,502,488 | 3/1996 | Nagasaki et al. | 348/300 |
| 5,515,311 | 5/1996 | Mihara | 257/295 |
| 5,548,475 | 8/1996 | Ushikubo et al. | 257/295 |
| 5,567,979 | 10/1996 | Nashimoto et al. | 257/627 |
| 5,572,052 | 11/1996 | Kashihara et al. | 257/295 |
| 5,623,439 | 4/1997 | Gotoh et al. | 257/295 |
| 5,686,745 | * 11/1997 | Lin et al. | 257/295 |
| 5,874,755 | * 2/1999 | Ooms et al. | 257/295 |

FOREIGN PATENT DOCUMENTS

| | | | |
|---|---|---|---|
| 61-97871 | 5/1986 | (JP) | 257/217 |
| 62-4370 | 1/1987 | (JP) | 257/295 |
| 5-235268 | 9/1993 | (JP) | 257/295 |
| 6-21477 | 1/1994 | (JP) | 257/295 |

OTHER PUBLICATIONS

Chen et al., "An Infrared Optical Field Effect Transistor with High Speed Response", Appl. Phys. Lett. 68(3), pp. 1–2, Jan. 15, 1996.

"Matsushita Uses $PbTiO_3$ Thin Film for High Response Speed Pyroelectric IR Imager", Nikkei Electronics Asia, pp. 36–37, Jan. 1993.

* cited by examiner

Primary Examiner—Donald L. Monin, Jr.
(74) Attorney, Agent, or Firm—Brown, Pinnisi & Michaels, PC

(57) ABSTRACT

An infrared optical field effect transistor has been developed using a thin film of Lead Titanate ($PbTiO_3$) deposited on a $n/p^+$ Si substrate by RF magnetron sputtering. This transistor possesses excellent pyroelectric properties and can, therefore, be operated even at room temperature. The infrared optical field effect transistor has the following features associated with rapid bulk channel structure and higher mobility:

1. Can be operated at room temperature, unlike quantum type IR sensors which can only operate at very low temperature (–100° C.~–200° C.), which results in higher costs.
2. High speed response with only 2.3 $\mu$s of rise time. This is much faster than other types of thermal infrared optical field effect transistors.
3. Easy to fabricate an integrated sensor device.

4 Claims, 6 Drawing Sheets

Rise(2)=2.325 $\mu$s        Fall(2)=5.375 $\mu$s

METHOD OF FABRICATING AN INFRARED OPTICAL BULK CHANNEL FIELD EFFECT TRANSISTOR

This application is a division of application Ser. No. 08/762,961, filed Dec. 12, 1996, now U.S. Pat. No. 5,838,034.

FIELD OF INDUSTRIAL APPLICATIONS

This "high speed infrared optical field effect transistor (FET)" uses titanic acid lead to form the ferroelectric thin film. Its design incorporates the high mobility of high speed bulk channel field effect transistors for greater effectiveness. The sensor has a wide range of applications including scientific, commercial and military applications, including laser detection, missile guidance, spectrum analysis, remote control, burglar alarm and thermoimage detection.

TECHNICAL BACKGROUND OF THE INVENTION

There are two main types of infrared sensor. 1) Thermoelectric sensors, and 2) quantum sensors. Thermoelectric sensors are superior to quantum sensors because:

1. They are able to operate at room temperature; Quantum sensors require a low temperature environment between −100° C.~−200° C. to operate.
2. Rapid response; Response time for thermoelectric sensors is faster than that for Golay cells (see Computers & Telecommunications, Volume 21, p.265, M. Okuyama, 1985).

Referring to Addison Wesely (John P. Uyemura, p.21 Chapter 1) reveals that traditional thermoelectric FETs which use surface channel designs suffer from scattering on the transistor surface and traps created during fabrication which reduce mobility.

According to M. Okuyama(Computers & Telecommunications and Ferroelectrics volume 63, p.243, 1985), the rise time of traditional thermoelectric FETs is 3.5 $\mu$S and electrical current is less than 1 $\mu$A. As direct switching is not possible, an amplifier is required, which delays switching time.

SUMMARY OF THE INVENTION

The main purpose of this invention is to provide a high speed and sensitive infrared optical FET that operates at room temperature, in this case by using rapid bulk channel structure of metal/ferroelectric thin film/semiconductor. The second purpose is to accommodate fabrication of VLSI for infrared optical FET which can also be developed as integrated IR OEIC.

The use of surface channels in conventional thermoelectric FETs is the reason behind their lower mobility and slower switching time. The inventor discovered that bulk channels can reduce equivalent resistance; furthermore, infrared rays cause compensatory charge variation in the depletion layer of components; this compensatory change is equivalent of its ferroelectric capacitance series with depletion capacitance. The compensatory charge variation of traditional surface channel FET is located at the inversion layer, and equivalent capacitance is only ferroelectric capacitance. According to the comparative method found in Physics of Semiconductor Devices(S.M.Sze, 1981),the developed infrared sensors using ferroelectric thin film will have lower equivalent capacitance.

Because the developed infrared optical FETs using ferroelectric thin film have lower resistance and capacitance, response speed is faster than that of conventional FETs. Additionally, its electrical current is significantly increased to reach above 100 $\mu$A, making it more sensitive.

| | |
|---|---|
| 1. | ... source |
| 2. | ... gate |
| 3. | ... drain |
| 4. | ... p-n Si semiconductor |
| 5. | ... ferroelectric thin film |
| 6. | ... substrate |

Figure 2:
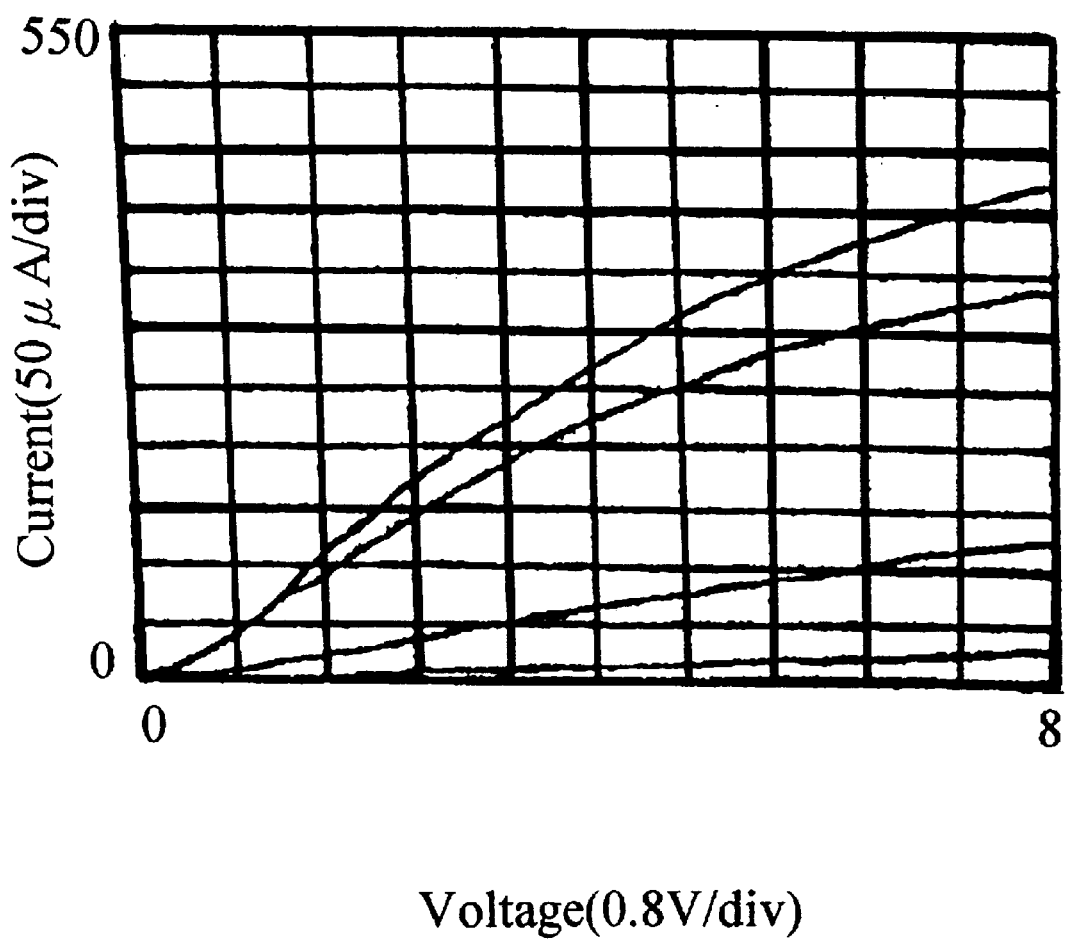

FIG. 2 depicts drain current/drain voltage curve with different infrared intensities.

Figure 3:
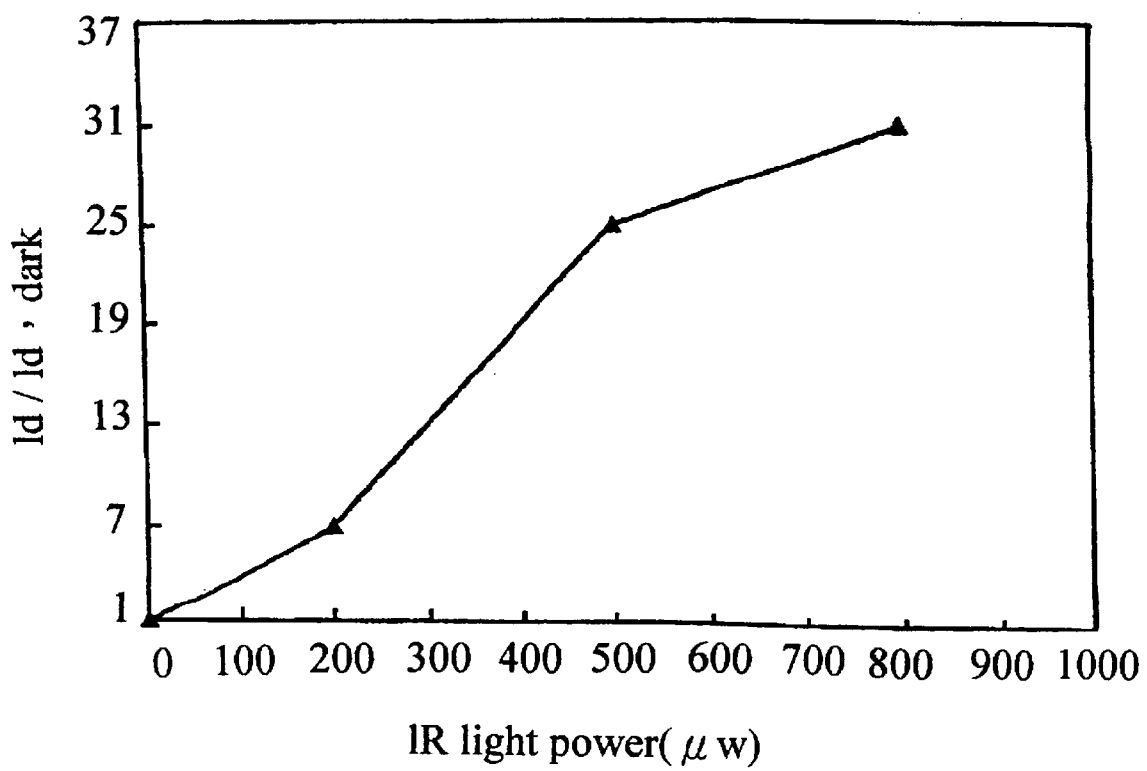

Infrared intensities are 0 $\mu$W, 200 $\mu$W, 500 $\mu$W, 800 $\mu$W in an upward progression.
vertical axis: 50 $\mu$A/div,
horizontal axis: 0.8 V/div FIG. 3 depicts effect of drain current with different infrared intensities.

"Id,dark" indicates drain dark current;

"Id" indicates drain current.

Figure 4:
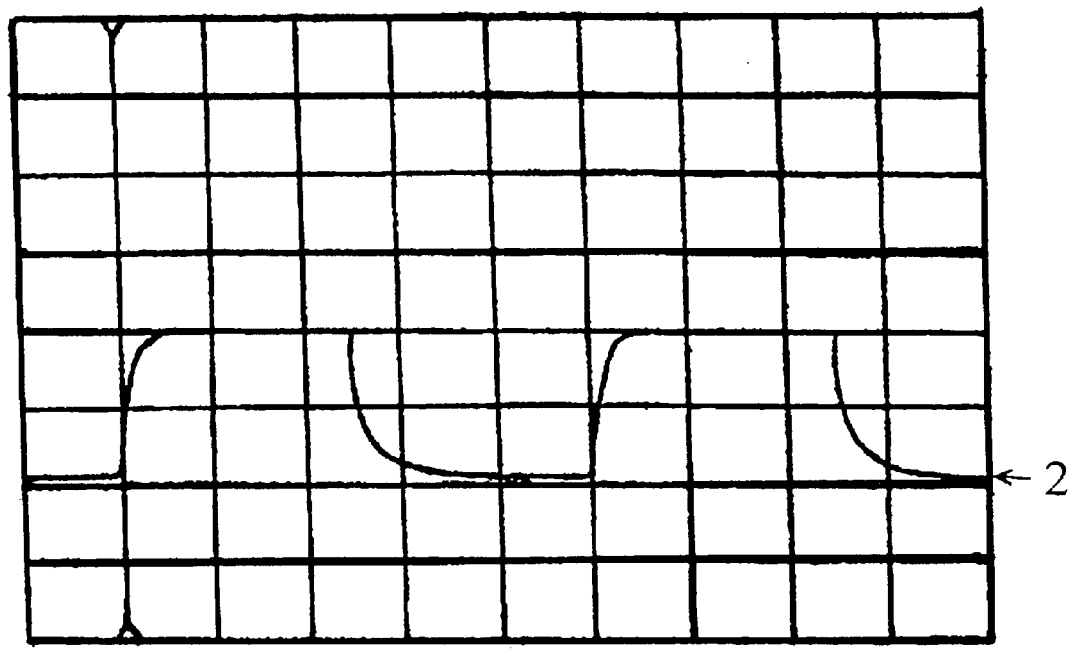

FIG. 4 depicts time response of bulk channel infrared optical FET vertical axis: 1V/div;

horizontal axis: 10 $\mu$s/div

FIG. 5 depicts after polar process, energy band at junction of ferroelectric thin film and semiconductor.

(a) unexposed
(b) exposed
501 ... ferroelectric
502 ... n layer
503 ... Ec
504 ... Ev
505 ... Depletion layer

DETAILED DESCRIPTION OF THE INVENTION

Figure 1:
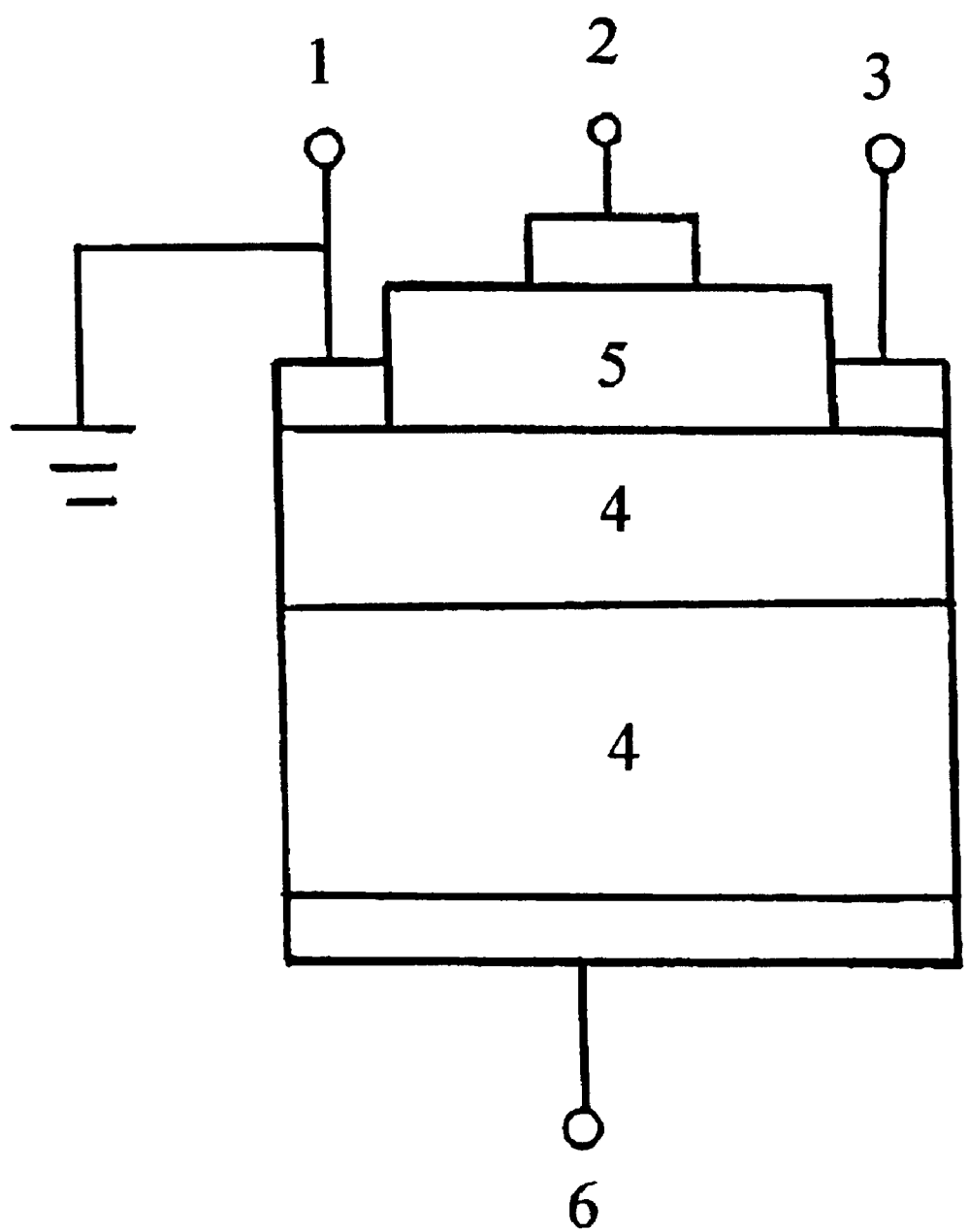
FIG. 1 depicts structure of bulk channel infrared optical FET

The architecture of infrared optical FETs which use ferroelectric thin film (5) and p-n junction of Si semiconductor (4) is illustrated in FIG. 1. Ferroelectric thin film is put on the top of central Si semiconductor, then metal thin film is put on as gate (2). At either sides of the gate are the source (1) and the drain (3) of metal thin film. At the bottom of Si semiconductor is substrate of metal thin film.

The p-n junction of the Si semiconductor described above can be either n/p+ or p/n$^+$. The substrate generally adopts semiconductor materials such as Si of IV family, CdS of II–VI family and GaAs of III–V family. Ferroelectric thin film (5) is used to sense infrared ray, and the gate is used as the radiation absorbing electrode.

Fabrication Procedure:

1. Clean the Si semiconductor substrate.
2. Ferroelectric thin film grows on Si semiconductor by using RF magnetron sputtering system.
3. Evaporate a gate of metal thin film on ferroelectric thin film.
4. Etch ferroelectric thin film by using photolithography to open source and drain windows.

5. Evaporate source and drain on either side of ferroelectric thin film.
6. Evaporate a substrate electrode on the other side of Si semiconductor. An infrared sensor of ferroelectric thin film is now complete.

The diameter of the target is 5 cm, the distance between target and substrate is 5 cm, growing power is 100 W, sputtering gas is mix of 90% Ar and 10% oxygen, growing pressure is 6 mtorr, temperature of substrate is 500° C. to 600° C., growing method of ferroelectric thin film can be either RF magnetron sputtering or laser evaporation.

Because ferroelectric thin film with good thermoelectric characteristics can be operated at room temperature, infrared sensors using ferroelectric thin film have the following features:

1. Able to operate at room temperature. It overcomes the necessity of low temperature devices for traditional quantum infrared sensors which can only operate in a −100° C.~−200° C. environment. This greatly reduces production costs.
2. Rapid response superior to that of other thermoelectric infrared optical FETs; rise time of only 2.3 $\mu$S.
3. It is easier to manufacture components for integrated infrared sensor.

Component Characteristics Test

Current/voltage curve is measured using the HP 4145B semiconductor parameter analyzer; response time is measured using the HP 54600A oscilloscope with an IR LED (wavelength of 970 nm) light source. FIG. 2 illustrates typical drain current/voltage curve of ferroelectric thin film infrared optical FET with different infrared intensities. FIG. 3 shows effect of drain current using different infrared intensities. FIG. 2 and FIG. 3 show that drain current increases as infrared intensity increases. FIG. 4 shows loading waveform which is measured using the HP 54600A oscilloscope. An infrared ray is used to irradiate the sensor to generate the current waveform.

Functions

We can see from the above that the invention has the following functions:

1. Although the quantum infrared sensor has a faster response time, it must operate in a −100° C.~−200° C. environment to inhibit noise. This can increase costs substantially. The optical field effect transistor has not only an excellent response time, but can also be operated at room temperature. No low temperature devices are needed.
2. Its high rapid response, with a rise time of only 2.3 $\mu$S, exceeds other thermoelectric infrared optical FETs.
3. It is easier to produce components for an integrated infrared sensor.

The explanation is made by a physical example with illustrations, which are intended to aid comprehension.

EXAMPLE

Figure 5A:
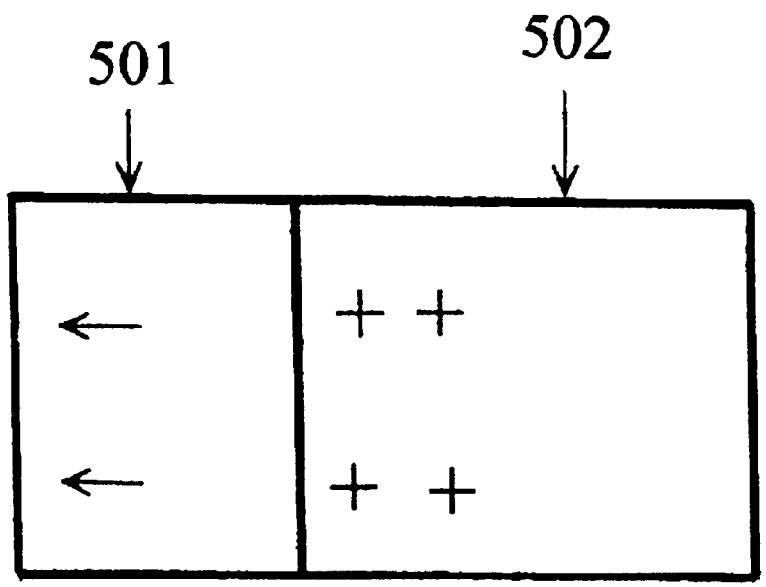
Figure 5A:
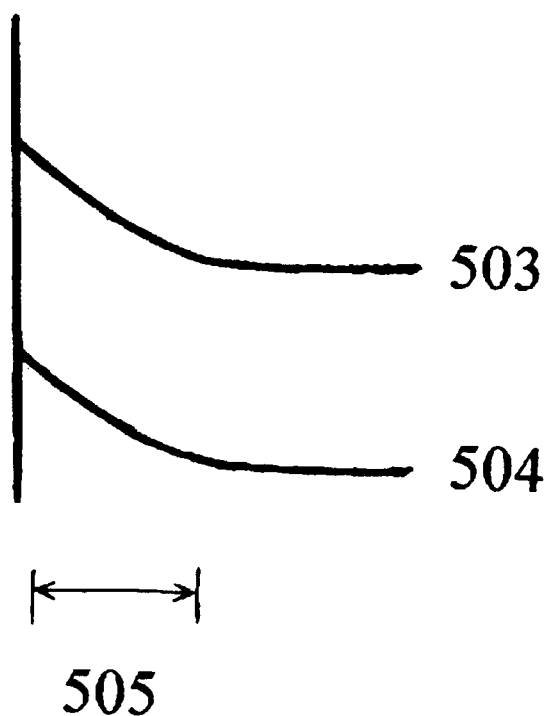
Figure 5B:
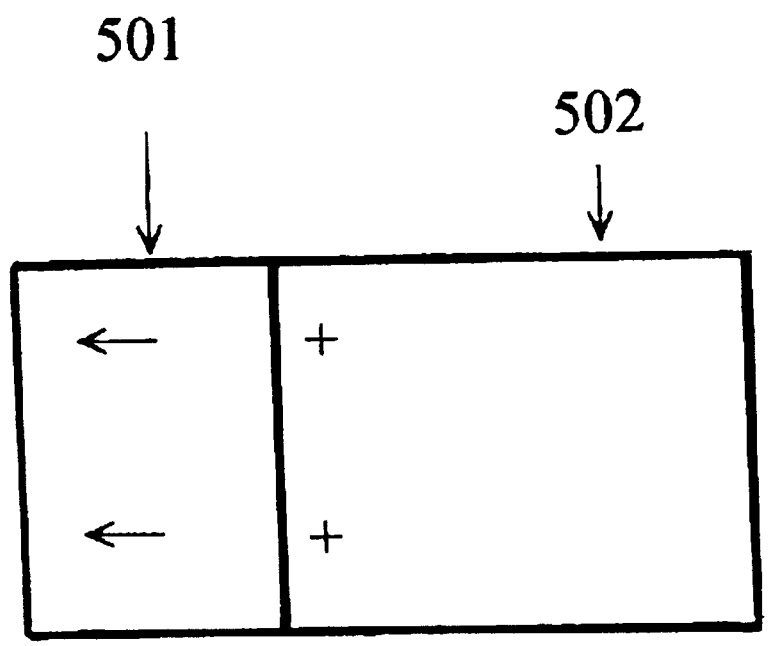
Figure 5B:
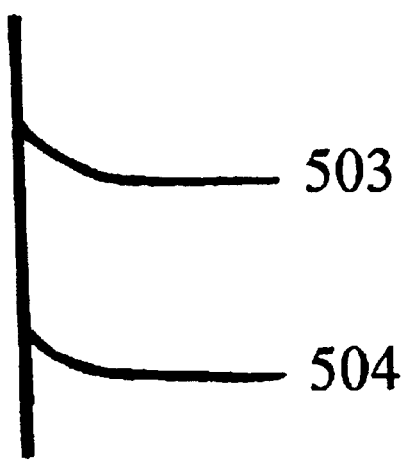
Figure 5B:
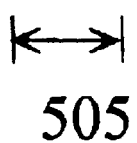

The sensor is able to be operated in depletion mode after it is processed by polarization, at 200° C., with −8V on gate about 20 minutes. After the polarization process, remanent polarization of the ferroelectric thin film generates an electrical field. The electrical field repels electrons in the n layer and creates a depletion region which has a positive charge. The energy band of semiconductor will bend upward as shown in FIG. 5(a). When the sensor is exposed to infrared radiation, the ferroelectric thin film absorbs it, causing a rise in temperature, weakening the polarization. The depletion region becomes narrow; the n type channel and drain conductance increase. Its energy band is shown in FIG. 5(b).

From the above description, an optical field effect transistor (FET) with high speed infrared response which uses titanic acid lead for its ferroelectric thin film is a real innovation.

What claims is:

1. A method of fabricating an infrared optical bulk channel field effect transistor, comprising:

forming a ferroelectric thin film on a Si substrate, the substrate, comprising a first semiconductor layer and a second semiconductor layer provided on the first semiconductor layer, the first semiconductor layer and the second semiconductor layer together forming a p-n junction;

forming a thin film of metal in a region of the ferroelectric thin film to form a gate electrode;

etching the ferroelectric thin film to form source and drain windows;

forming a source electrode over the source window and forming a drain electrode over the drain window; and forming a substrate electrode on an opposite side of the Si substrate from the ferroelectric thin film.

2. A method of fabricating an infrared optical bulk channel field effect transistor as recited in claim 1, wherein the ferroelectric thin film is a thin film of titanic acid lead.

3. A method of fabricating an infrared optical bulk channel field effect transistor as recited in claim 1, wherein the ferroelectric thin film is formed by RF magnetron sputtering or laser evaporation.

4. A method of fabricating an infrared optical bulk channel field effect transistor as recited in claim 3, wherein the ferroelectric thin film is a thin film of titanic acid lead.

* * * * *